United States Patent [19]

Crosby

[11] Patent Number: 4,910,480

[45] Date of Patent: Mar. 20, 1990

[54] HIERARCHICAL CURRENT AMPLIFIER

[75] Inventor: Philip S. Crosby, Portland, Oreg.

[73] Assignee: Tektronix, Inc., Beaverton, Oreg.

[21] Appl. No.: 384,388

[22] Filed: Jul. 25, 1989

[51] Int. Cl.⁴ .............................................. H03F 3/04
[52] U.S. Cl. ..................................... 330/288; 323/315
[58] Field of Search ................. 330/288; 323/315, 316

[56] References Cited

U.S. PATENT DOCUMENTS 4,647,870  3/1987  Ishii ................................. 323/315 X Primary Examiner—James B. Mullins
Attorney, Agent, or Firm—Peter J. Meza

[57] ABSTRACT

A hierarchical current amplifier includes a first current mirror tier including a current mirror having an input coupled to an amplifier base terminal for receiving an input current, an output coupled to an amplifier collector terminal, and a pair of emitter terminals. A second current mirror tier includes two current mirrors corresponding to each emitter terminal in the first current mirror tier, each current mirror having an input coupled to one of the emitter terminals of the current mirror in the first current mirror tier. The two current outputs in the second tier are coupled to the amplifier collector terminal to provide current gain. Successive tiers of current mirrors may be added to provide more current gain. Each successive tier includes a current mirror corresponding to each emitter terminal in the previous current mirror tier, each current mirror having an input coupled to one of the emitter terminals of the previous current mirror tier, an output coupled to the amplifier collector terminal, and a pair of emitter terminals with the emitter terminals in the last tier being coupled to the amplifier emitter terminal.

6 Claims, 2 Drawing Sheets

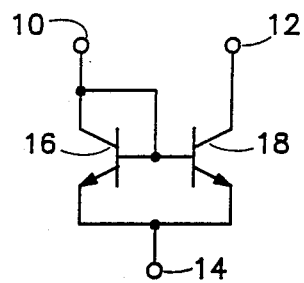
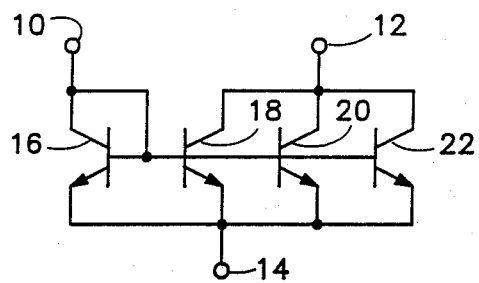
FIG.1 (PRIOR ART)
FIG.2 (PRIOR ART)
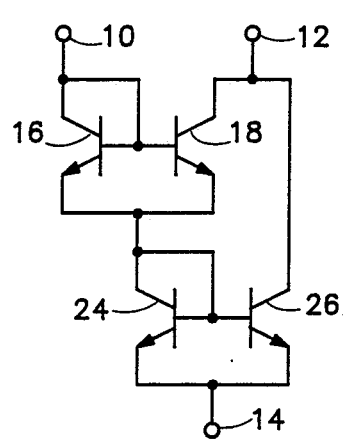
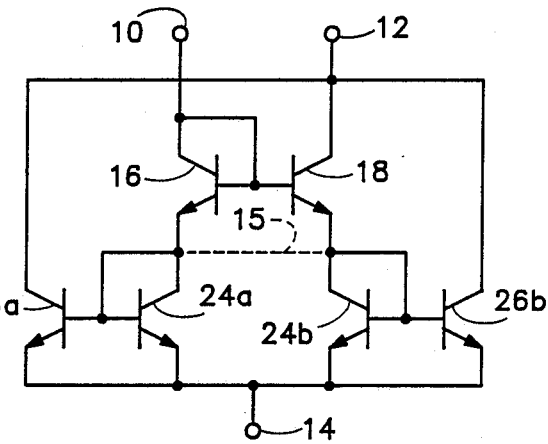
FIG.3A (PRIOR ART)
FIG.3B
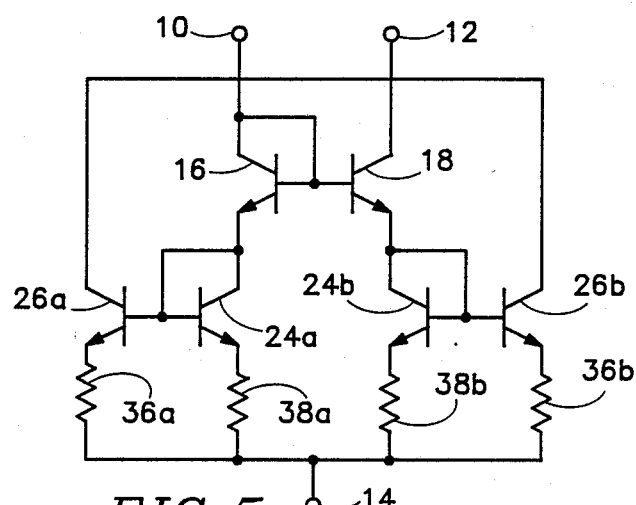
FIG.5

HIERARCHICAL CURRENT AMPLIFIER

BACKGROUND OF THE INVENTION

This invention relates to current amplifiers and more specifically to cascaded current mirror amplifiers.

A conventional current mirror is shown in FIG. 1 that is commonly found in both integrated and discrete amplifier and biasing circuitry. An input transistor 16 has a coupled base and collector to receive an input current at input terminal 10. An output transistor 18 has a base coupled to the base of input transistor 16. The collector of output transistor 18 provides the output current to output terminal 12. The emitter of transistor 16 and 18 are coupled together and to emitter terminal 14. Emitter terminal 14 is coupled to ground, a source of constant supply voltage, or to other circuitry. The gain of the current mirror shown in FIG. 1 is approximately unity. Alternatively, the current mirror of FIG. 1 may be regarded as an equivalent transistor having a current gain of approximately unity wherein terminal 10 is the base, terminal 12 is the collector, and terminal 14 is the emitter. Thus, terminal 10 is subsequently referred to as the amplifier base terminal, terminal 12 is referred to as the amplifier collector terminal, and terminal 14 is referred to as the amplifier emitter terminal in FIGS. 1-5.

The conventional method for obtaining current gain from a current mirror is shown in FIG. 2. In this circuit, output transistors 20 and 22 are coupled in parallel with output transistor 18. Therefore, the gain of the current amplifier is three, or alternatively, an equivalent transistor is shown having a current gain of three. However, as the current gain is increased by adding successive parallel output transistors, the corresponding −3 dB rolloff frequency decreases.

A cascaded current amplifier having improved frequency response characteristics is shown in FIG. 3A. In this circuit, the emitter current from a first current mirror including transistors 16 and 18 is returned to the input of a second current mirror including input transistor 24 and output transistor 26. Since the emitter current from the first current mirror is twice as large as the input current at amplifier base terminal 10, the size of transistors 24 and 26 is chosen to be twice as large as transistors 16 and 18. Since the collector of transistor 18 and transistor 26 are coupled together and to the amplifier collector terminal 12, the current gain of the amplifier shown in FIG. 3A is also three, or alternatively, an equivalent transistor is shown having a current gain of three. The bandwidth of the circuit shown in FIG. 3A is substantially improved over the circuit shown in FIG. 2 at the same gain.

The current mirror amplifier of FIG. 3A may be cascaded using several current mirrors, with the emitter current of the previous current mirror being directed to the input of the next current mirror. In such a configuration, each current mirror output current is summed, and device sizes are doubled in each succeeding current mirror. For N current mirror stages the total current gain is 2N+1.

The circuit of FIG. 3A, while representing an improvement in frequency response beyond the prior art circuit of FIG. 2, contains unnecessary connections that result in a less than optimal frequency response, difficulty of layout in an integrated circuit or etched circuit board, and potential current crowding if the devices used are not precisely matched. Therefore what is desired is a hierarchical current amplifier having fewer interconnections that would optimize frequency response, simplify layout, and reduce current crowding.

SUMMARY OF THE INVENTION

According to the present invention, a hierarchical current amplifier is provided having fewer interconnections than prior art cascaded current amplifiers. The current amplifier includes a first current mirror tier including a current mirror having an input coupled to an amplifier base terminal for receiving an input current, an output coupled to an amplifier collector terminal, and a pair of emitter terminals; a second current mirror tier includes two current mirrors corresponding to each emitter terminal in the first current mirror tier, each current mirror having an input coupled to one of the emitter terminals of the current mirror in the first current mirror tier. The two current outputs in the second tier are coupled to the amplifier collector terminal to provide current gain. Successive tiers of current mirrors may be added to provide more current gain. Each successive tier includes a current mirror corresponding to each emitter terminal in the previous current mirror tier, each current mirror having an input coupled to one of the emitter terminals of the previous current mirror tier, an output coupled to the amplifier collector terminal, and a pair of emitter terminals with the emitter terminals in the last tier being coupled to the amplifier emitter terminal.

It is therefore an object of the present invention to provide a hierarchical current amplifier with improved frequency response over prior art cascaded current mirror amplifiers.

It is another object of the present invention to provide a circuit topology that will yield a simpler layout and reduce the number of crossover needed.

It is another object of the present invention to provide a circuit topology that uses equal size devices but minimizes current crowding effects.

The foregoing and other objects of the present invention will become apparent from the following description and drawings. It is to be understood that the embodiments described are not intended to be limiting of the invention but are given for purposes of illustration in order that others skilled in the art may fully understand the invention.

BRIEF DESCRIPTION OF THE DRAWINGS

FIG. 1 is schematic diagram of a conventional prior art current mirror;

FIG. 2 is a schematic diagram of a conventional prior art current mirror having a current gain of three;

FIG. 3A is a schematic diagram of a prior art cascaded current mirror having improved frequency response characteristics and a current gain of three;

FIG. 3B is a schematic diagram of a transitional form of a hierarchical current amplifier according to the present invention;

FIG. 5 is a schematic diagram of a hierarchical current amplifier according to the present invention having two current mirror tiers, a current gain of three, and four emitter ballast resistors.

DETAILED DESCRIPTION

Figure 4:
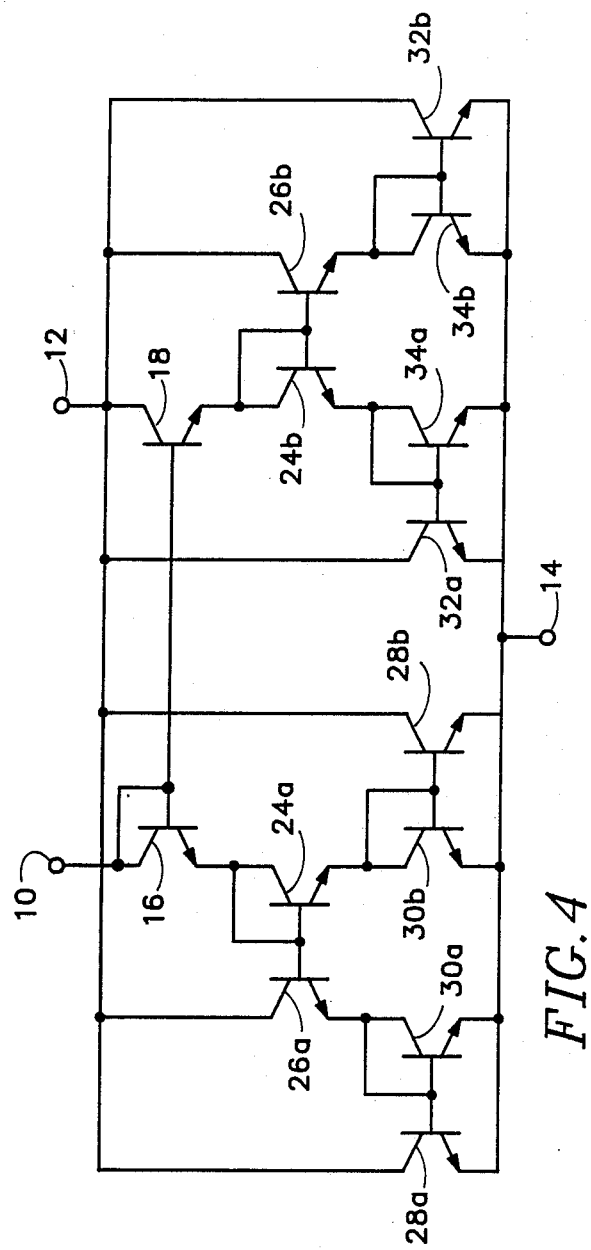
FIG. 4 is a schematic diagram of a hierarchical current amplifier according to the present invention having thee current mirror tiers and a current gain of seven.

Referring now to the drawing figures and in particular to the transitional current mirror amplifier shown in FIG. 3B, the transistors shown are of equal size, but the amplifier is otherwise the electrical equivalent of the current mirror amplifier in FIG. 3A. Thus, double sized transistor 24 has been redrawn as single sized transistors 24a and 24b and double sized transistor 26 has been redrawn as single sized transistors 26a and 26b. When the current mirror amplifier is redrawn using devices having equal areas, redundant connections, indicated by hatched line 15 become apparent. Hatched line 15 represents the redundant connection between the coupled collector and base of transistor 24a and the coupled collector and base of transistor 24b, as well as the redundant connection between the collector of transistor 26a and the collector of transistor 26b.

Assuming that hatched line 15 is removed and that transistors 16, 18, 24a, 24b, 26a, and 26b are of equal size, FIG. 3B represents a first embodiment of a hierarchical current amplifier according to the present invention having a current gain of three.

The hierarchical current amplifier includes an amplifier base terminal 10 for receiving an input current and an amplifier collector terminal 12 that sums the current contributions from the collectors of transistors 18, 26a, and 26b. A first current mirror includes an input transistor 16 having a coupled base and collector that forms the input of the current mirror and is coupled to the amplifier base terminal 10. The first current mirror also includes an output bipolar transistor 18 having a base coupled to the base of the input transistor 16 and a collector forming the output of the current mirror coupled to the amplifier collector terminal 12.

A second current mirror includes input transistor 24a and output transistor 26a, and a third current mirror includes input transistor 24b and 26b. The input and output of the second current mirror is the coupled collector and base of transistor 24a and the collector of transistor 26a, respectively. The input and output of the third current mirror is the coupled collector and base of transistor 24b and the collector of transistor 26b, respectively. The second current mirror has the input coupled to the emitter terminal of transistor 16, an output coupled to the amplifier collector terminal 12, and a pair of emitter terminals coupled to the amplifier emitter terminal 14. The third current mirror has an input coupled to the emitter terminal of transistor 18, an output coupled to the amplifier collector terminal 12, and a pair of emitter terminals coupled to the amplifier emitter terminal 14.

The gain of the current amplifier shown in FIG. 3B is three. Assuming one unit of current flows into the amplifier base terminal 10, one unit of current flows in the collector of transistor 18. One unit of current flows in each of the emitters of transistors 16 and 18 producing one unit of current in the collectors or transistors 26a and 26b. The three units of current are summed at amplifier collector terminal 12.

An alternative embodiment of a hierarchical current amplifier according to the present invention is shown in FIG. 4 that has three cascaded sections or tiers of current mirrors and a gain of seven. The hierarchical current amplifier includes an amplifier base terminal 10 and amplifier collector terminal 12. A first current mirror tier includes a current mirror including transistors 16 and 18 having the input coupled to the amplifier base terminal 10, the output coupled to the amplifier collector terminal 12, and a pair of emitter terminals. A second current mirror tier includes a current mirror corresponding to each emitter terminal in the first current mirror tier. The two current mirrors include transistors 24a and 26a, and transistors 24b and 26b. Each current mirror input is coupled to one of the emitter terminals of the current mirror in the first current mirror tier, the emitter terminal of transistors 16 and 18, respectively. The outputs of each current mirror are coupled to the amplifier collector terminal 12.

It is apparent from FIG. 4 that successive tiers of current mirrors may be added as more gain is desired. The last tier of current mirrors may be designated the Nth current mirror tier where N would be an integer greater than two. Therefore, the Nth current mirror tier includes a current mirror corresponding to each emitter terminal in the (N−1)th current mirror tier, each current mirror having an input coupled to one of the emitter terminals of the (N−1)th current mirror tier, an output coupled to the amplifier collector terminal 12, and a pair of emitter terminals coupled to the amplifier emitter terminal 14. Thus the current mirrors in the Nth or third current mirror tier have inputs represented by the coupled base and collector of transistors 30a, 30b, 34a, and 34b coupled to emitter terminals of transistors 26a, 24a, 24b, and 26b, respectively, in the (N−1)th or second current mirror tier. Similarly, the outputs of the current mirrors in the Nth or third current mirror tier represented by the collector of transistors 28a, 28b, 32a, and 32b are coupled to the amplifier collector terminal 12 where the current contributions are summed with the outputs from previous current mirror tiers.

In the current amplifier of FIG. 4 many redundant connections are eliminated in the same manner as the current amplifier of FIG. 3B. Thus the emitter currents of transistors 24a and 26a, and 24b and 26b are not first summed before they are used as an input to the next successive current mirror tier as is the case in the cascaded current mirror shown in FIG. 3A. A consequence of removing the redundant connections is that the bandwidth of the circuit is increased. It can be shown that at high frequencies the emitter currents in an individual current mirror are phase shifted with respect to each other due to collector-base capacitance and other transistor parasitic resistances and capacitances, as well as other factors. This produces partial cancellation of the high frequency components of the summed emitter currents, resulting in reduced bandwidth. The bandwidth loss increases as successive current mirrors are cascaded in the manner shown in the circuit of FIG. 3A. Since the current amplifier according to the present invention uses separate current paths for the emitter currents, attenuation of high frequency current is reduced.

Circuit simulations using a computer model of a commercially available 2N3904 transistor confirm the higher frequency response of hierarchical current amplifier. The computer simulation confirmed that the frequency response of the hierarchical current amplifier was superior to both the conventional current mirror and the cascaded current amplifier. The following table presents the results of the computer simulation, showing the 3dB frequency vs. current gain for the conventional current amplifier as shown in FIGS. 1 and 2, the summed cascaded current amplifier as shown in FIG. 3A, and the hierarchical current amplifier according to the present invention as shown in FIGS. 3B−5.

| Conventional Current Amp, | Gain of 3 | 83.2 MHz |
| Summed Cascaded Current Amp, | Gain of 3 | 124 MHz |
| Hierarchical Current Amp, | Gain of 3 | 128 MHz |
| Conventional Current Amp, | Gain of 7 | 42.4 MHz |
| Summed Cascaded Current Amp, | Gain of 7 | 95.5 MHz |
| Hierarchical Current Amp, | Gain of 7 | 102 MHz |
| Conventional Current Amp, | Gain of 15 | 22.4 MHz |
| Summed Cascaded Current Amp, | Gain of 15 | 77.6 MHz |
| Hierarchical Current Amp, | Gain of 15 | 84.6 MHz |

A further advantage of the present invention is the ease of layout in either integrated or discrete form. It is deemed clear the elimination of the redundant emitter current summing as well as the use of equal sized devices reduces the need for crossovers and simplifies the layout. It should also be noted that the use of equal sized devices enables ieexpensive discrete transistors to be used that otherwise would require expensive power devices or integrated circuits with extensive cooling means.

Another advantage of the present invention is the reduction of current crowding in the prior art current mirror shown in FIG. 2. Since only two devices need be matched instead of N+1 devices, where N is the gain of the current mirror, current crowding is less of a problem. One way to reduce current crowding is to add an emitter ballast resistor between the amplifier emitter terminal 14 to every transistor in the last tier of current mirrors. Note that in the prior art circuit of FIG. 2, all the devices must be ballasted, whereas in the ballasted hierarchical current amplifier shown in FIG. 5, only M/2+1 devices need be ballasted, where M is the total number of devices in the circuit. Thus emitter ballast resistors 36a, 38a, 38b, and 36b are in series between the emitters of transistors 26a, 24a, 24b, and 26b, and the amplifier emitter terminal 14.

While there has been shown and described the preferred embodiment of the present invention it will be apparent to those skilled in the art that many changes and modifications may be made without departing from the invention in its broader aspects. For example, the transistors may be integrated or discrete, PAP or NON if appropriate biasing is used, or any other three terminal device such as an enhancement gate GET. Further, while the invention is constructed of a hierarchical configuration of two transistor current mirrors, any form of current mirror including but not limited to the Widlar current mirror, Wilson current mirror, or base current compensated current mirror may be used. It is also appreciated by those skilled in the art that amplifier emitter terminal 14 may be coupled to ground, to a voltage source, to another circuit node, or may serve as a voltage output terminal. The appended claims therefore cover all such changes and modifications as fall therewithin.

I claim:

1. A hierarchical current amplifier comprising:
   (a) an amplifier base terminal, an amplifier collector terminal, and an amplifier emitter terminal;
   (b) a first current mirror having an input coupled to the amplifier base terminal, an output coupled to the amplifier collector terminal, and first and second emitter terminals;
   (c) a second current mirror having an input coupled to the first emitter terminal of said first current mirror, an output coupled to the amplifier collector terminal, and a pair of emitter terminals coupled to the amplifier emitter terminal; and
   (d) a third current mirror having an input coupled to the second emitter terminal of said first current mirror, an output coupled to the amplifier collector terminal, and a pair of emitter terminals coupled to the amplifier emitter terminal.

2. A hierarchical current amplifier as in claim 1 further comprising an emitter ballast resistor coupled between each of the emitter terminals of said second and third current mirrors and the amplifier emitter terminal.

3. A hierarchical current amplifier as in claim 1 wherein each of said first, second, and third current mirrors comprise a first bipolar transistor having a coupled base and collector forming the input, and a second bipolar transistor having a base coupled to the base of the first bipolar transistor and a collector forming the output.

4. A hierarchical current amplifier comprising:
   (a) an amplifier base terminal, an amplifier collector terminal, and an amplifier emitter terminal;
   (b) a first current mirror tier including a current mirror having an input coupled to the amplifier base terminal, an output coupled to the amplifier collector terminal, and a pair of emitter terminals;
   (c) a second current mirror tier including a current mirror corresponding to each emitter terminal in said first current mirror tier, each current mirror having an input coupled to one of the emitter terminals of the current mirror in said first current mirror tier, an output coupled to the amplifier collector terminal, and a pair of emitter terminals;
   (d) an Nth current mirror tier including a current mirror corresponding to each emitter terminal in an (N−1)th current mirror tier, each current mirror having an input coupled to one of the emitter terminals of said (N−1)th current tier, an output coupled to the amplifier collector terminal, and a pair of emitter terminals coupled to the amplifier emitter terminal, wherein N is an integer greater than two.

5. A hierarchical current amplifier as in claim 4 further comprising an emitter ballast resistor coupled between each of the emitter terminals in said Nth tier of current mirrors and the amplifier emitter terminal.

6. A hierarchical current amplifier as in claim 4 wherein each of the current mirrors comprise a first bipolar transistor having a coupled base and collector forming the input, and a second bipolar transistor having a base coupled to the base of the first bipolar transistor and a collector forming the output.

* * * * *